(12) United States Patent
Tsuchiya et al.

(10) Patent No.: US 11,223,193 B2
(45) Date of Patent: Jan. 11, 2022

(54) CIRCUIT PROTECTION DEVICE AND VOLTAGE DETECTION DEVICE

(71) Applicant: KEIHIN CORPORATION, Tokyo (JP)

(72) Inventors: Shingo Tsuchiya, Utsunomiya (JP); Seiji Kamata, Utsunomiya (JP)

(73) Assignee: HITACHI ASTEMO, LTD., Hitachinaka (JP)

( * ) Notice: Subject to any disclaimer, the term of this patent is extended or adjusted under 35 U.S.C. 154(b) by 37 days.

(21) Appl. No.: 16/463,179

(22) PCT Filed: Feb. 8, 2018

(86) PCT No.: PCT/JP2018/004365
§ 371 (c)(1),
(2) Date: May 22, 2019

(87) PCT Pub. No.: WO2018/168273
PCT Pub. Date: Sep. 20, 2018

(65) Prior Publication Data
US 2020/0067302 A1 Feb. 27, 2020

(30) Foreign Application Priority Data
Mar. 17, 2017 (JP) .............................. JP2017-052151

(51) Int. Cl.
*H02H 3/20* (2006.01)
*H02H 1/00* (2006.01)
*H02H 9/00* (2006.01)

(52) U.S. Cl.
CPC .......... *H02H 3/202* (2013.01); *H02H 1/0007* (2013.01); *H02H 9/00* (2013.01)

(58) Field of Classification Search
CPC ......... H02H 3/202; H02H 1/0007; H02H 9/00
(Continued)

(56) References Cited

U.S. PATENT DOCUMENTS 3,501,677 A * 3/1970 Hurtle .................... H02H 3/025
361/100
5,856,904 A * 1/1999 Pelly ........................ H02H 3/50
361/111
(Continued)

FOREIGN PATENT DOCUMENTS

| CN | 1188973 A | 7/1998 |
|---|---|---|
| CN | 204167878 U | 2/2015 |

(Continued)

OTHER PUBLICATIONS

International Search Report corresponding to Application No. PCT/JP2018/004365; dated Apr. 24, 2018.
(Continued)

*Primary Examiner* — Yemane Mehari
(74) *Attorney, Agent, or Firm* — Cantor Colburn LLP

(57) ABSTRACT

A circuit protection device is provided between a direct-current power supply and a protection object circuit connected to the direct-current power supply, and protects the protection object circuit from an overvoltage of the direct-current power supply by shutting off a connection between the direct-current power supply and the protection object circuit using a predetermined interrupting element. The circuit protection device includes a bypass circuit which suppresses an electric alternating-current component from flowing to the interrupting element.

3 Claims, 4 Drawing Sheets

(58) Field of Classification Search
USPC .................................. 361/86, 87, 91.1, 93.9
See application file for complete search history.

(56) References Cited

U.S. PATENT DOCUMENTS

| | | | |
|---|---|---|---|
| 6,072,691 A | 6/2000 | Suhara et al. | |
| 8,582,263 B2 * | 11/2013 | Butler | H02H 9/025 361/91.1 |
| 2013/0342939 A1 * | 12/2013 | Itou | B60L 3/0046 361/55 |

FOREIGN PATENT DOCUMENTS

| | | | | |
|---|---|---|---|---|
| CN | 104393643 A | 3/2015 | | |
| CN | 205070469 U | 3/2016 | | |
| CN | 106145049 A | 11/2016 | | |
| EP | 0573785 A1 | 12/1993 | | |
| JP | 2008301629 A | 12/2008 | | |
| JP | 2010288358 A | 12/2010 | | |
| JP | 2012005305 A | 1/2012 | | |
| JP | 2014007883 A | 1/2014 | | |
| JP | 5585616 B | 9/2014 | | |
| JP | 2015235068 A * | 12/2014 | ............ | G01R 31/02 |
| WO | 2015015549 A1 | 2/2015 | | |

OTHER PUBLICATIONS

JPO Notice of Allowance corresponding to Application No. 2017-052151; dated Dec. 4, 2018.
CNIPA Office Action for corresponding CN Application No. 2018880005265.7; dated Nov. 4, 2020, with translation of the Search Report.

* cited by examiner

CIRCUIT PROTECTION DEVICE AND VOLTAGE DETECTION DEVICE

CROSS REFERENCE TO RELATED APPLICATIONS

This is the U.S. national stage of International Application No. PCT/JP2018/004365, filed on Feb. 8, 2018. Priority under 35 U.S.C. § 119(a) and 35 U.S.C. § 365(b) is claimed from Japanese Application No. 2017-052151, filed on Mar. 17, 2017, the disclosures all of which are also incorporated herein by reference.

TECHNICAL FIELD

The present invention relates to a circuit protection device and a voltage detection device.

BACKGROUND ART

A circuit protection device which protects a monitoring circuit for monitoring a voltage of a power supply unit is disclosed in Patent Document 1 below. This circuit protection device has, as clearly shown in FIG. 2, fuses each inserted into a plurality of detection lines that connect the power supply unit and a monitoring circuit, and Zener diodes each provided between adjacent detection lines. In this circuit protection device, when an overvoltage occurs in the power supply unit, an interval between detection lines becomes short-circuited by a Zener diode, and as a result, the fuse is melted and cut, and thereby an electrical connection between the power supply unit and the monitoring circuit is shut off.

CITATION LIST

Patent Document

Patent Document 1
Japanese Patent No. 5585616

SUMMARY OF INVENTION

Technical Problem

In the circuit protection device described above, not only an overvoltage occurring in the power supply unit but also noise mixed in the detection lines and the like causes the Zener diode to perform a yield operation, and thereby there is a concern that a fuse which is a type of an interrupting element may operate (be melted and cut). That is, when noise with an amplitude equal to or larger than a breakdown voltage of the Zener diode is mixed in the detection lines or the like, an interval between the detection lines becomes short-circuited, and thereby fuses are melted and cut.

Aspects of the present invention have been made in view of the above circumstances, and an object thereof is to provide a circuit protection device and a voltage detection device capable of preventing an operation of an interrupting element due to noise.

Solution to Problem

In order to achieve the aforementioned objects, the present invention has adopted the following aspects.

(1) A circuit protection device according to one aspect of the present invention is a circuit protection device that is provided between a direct-current power supply and a protection object circuit connected to the direct-current power supply, and protects the protection object circuit from an overvoltage of the direct-current power supply by shutting off a connection between the direct-current power supply and the protection object circuit using a predetermined interrupting element, and includes a bypass circuit which suppresses an electric alternating-current component from flowing to the interrupting element.

(2) In the aspect of (1) described above, the bypass circuit may be a capacitor with at least one end thereof connected to an input end of the interrupting element.

(3) In the aspect of (2) described above, the interrupting element may be provided for each electrode of the direct-current power supply, and the capacitor may be provided to connect input ends of a pair of interrupting elements.

(4) In the aspect of (3) described above, the direct-current power supply may be a battery pack in which a plurality of battery cells are connected in series, and the capacitor may be provided to correspond to every other one of adjacent battery cells.

(5) In the aspect of (2) described above, the interrupting element may be provided for each electrode of the direct-current power supply, and the other end of the capacitor may be connected to an output end of the interrupting element.

(6) A voltage detection device according to another aspect of the present invention includes the circuit protection device according to any one of the aspects (1) to (5), and a voltage detection circuit which is the protection object circuit and detects a voltage of the direct-current power supply.

Advantageous Effects of Invention

According to the present invention, a circuit protection device includes a bypass circuit which suppresses an electric alternating-current component from flowing to the interrupting element. Accordingly, it is possible to provide a circuit protection device and a voltage detection device, capable of preventing an operation of the interrupting element due to noise.

DESCRIPTION OF EMBODIMENTS

Hereinafter, embodiments of the present invention will be described with reference to the drawings.

First Embodiment

Figure 1:
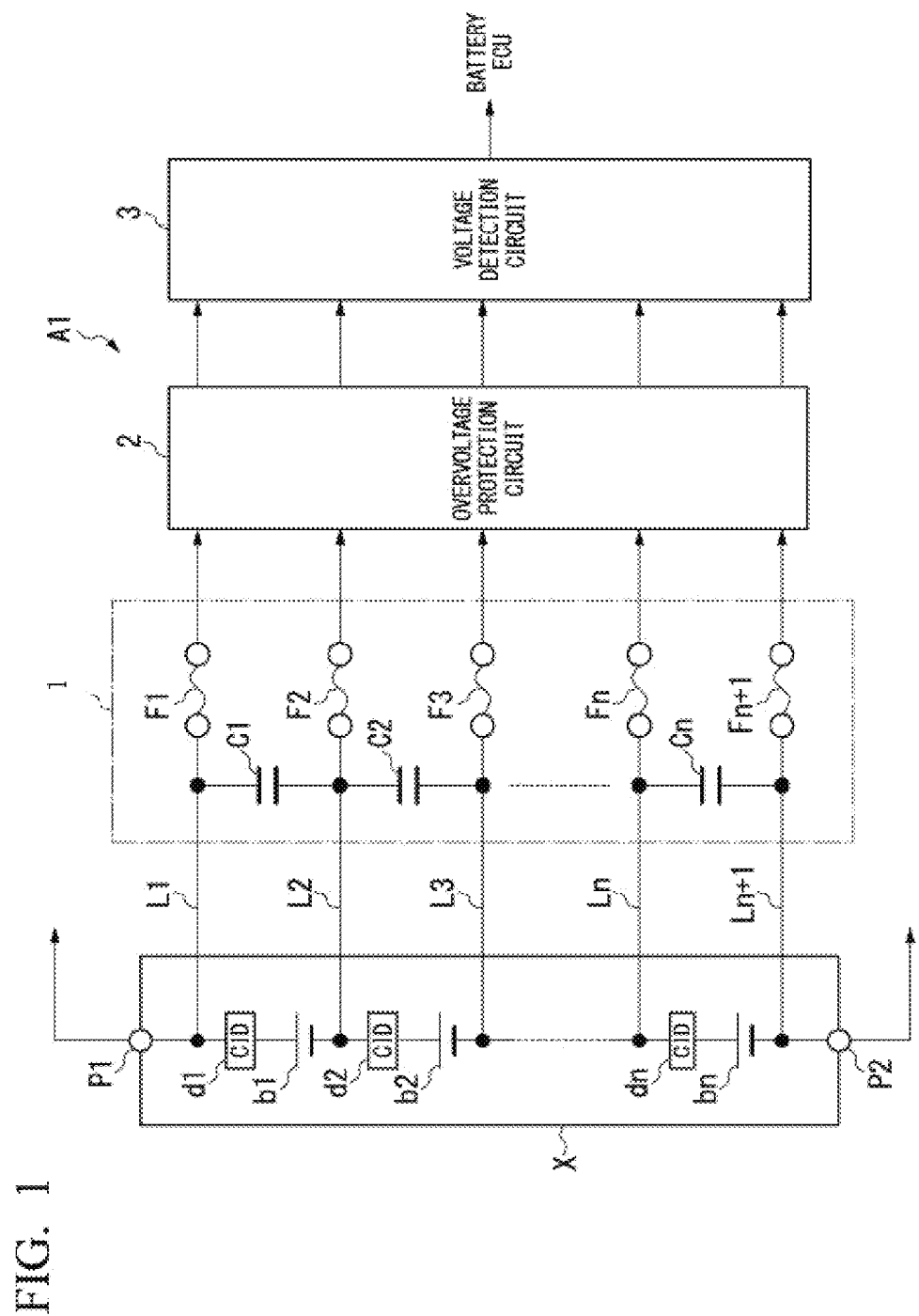
FIG. 1 is a circuit diagram which shows an overall configuration of a voltage detection device A1 according to a first embodiment of the present invention.

First, a first embodiment of the present invention will be described with reference to FIG. 1 and FIG. 2. As shown in FIG. 1, a voltage detection device A1 according to the first embodiment is a device for detecting a battery pack X and includes a shut-off circuit 1, an overvoltage protection circuit 2, and a cell voltage monitoring circuit 3. Note that the shut-off circuit 1 among these components corresponds to a circuit protection device in the present invention, and the cell voltage monitoring circuit 3 corresponds to a protection object circuit and a voltage detection circuit in the present invention.

First, the battery pack X is a direct-current power supply (battery) installed in a vehicle such as an electric vehicle or a hybrid automobile, and is a secondary battery such as a lithium-ion battery or a nickel hydrogen battery. This battery pack X includes a plurality of battery cells b1 to bn connected to each other in series as shown in the drawings. Such a battery pack X supplies direct current power to, for example, an inverter that drives a traveling motor that generates traveling power of a vehicle. That is, a positive terminal P1 of the battery pack X is connected to one input end of the inverter, and a negative terminal P2 of the battery pack X is connected to the other input end of the inverter. Note that "n" described above is a natural number of 2 or more.

Each of the battery cells b1 to bn includes a current interrupt device (CID) d1 to dn as shown in the drawings. That is, a battery cell b1 has a CID d1, a battery cell b2 has CID d2, a battery cell b3 has CID d3, (omitted), and the battery cell bn has a CID dn. As shown in the drawings, the CIDs d1 to dn are provided on the positive terminal side of each of the battery cells b1 to bn and are interrupting elements (disconnecting elements) that mechanically release positive terminals of the battery cells b1 to bn by operating if an internal pressure of a corresponding battery cell excessively rises due to an abnormality of the corresponding battery cell.

Such a battery pack X is connected to the voltage detection device A1 via (n+1) connection lines L1 to Ln+1. In this battery pack X, if any one of the battery cells b1 to bn is abnormal, the corresponding CID operates to separate the abnormal battery cell (abnormal cell) from other normal battery cells (normal cells). In addition, overvoltage deviating from a normal voltage range is applied to a pair of connection lines adjacent to each other, which correspond to the abnormal cell in which the CID has operated. For example, referring to FIG. 2, if the battery cell b1 is abnormal, the CID d1 operates, and as a result, overvoltage is applied between a pair of connection lines L1 and L2.

The shut-off circuit 1 is provided between the battery pack X and the overvoltage protection circuit 2, and is connected to the battery pack X by the (n+1) connection lines L1 to Ln+1. This shut-off circuit 1 includes n capacitors C1 to Cn and (n+1) fuses F1 to Fn+1 (interrupting elements) as shown in the drawings. These n capacitors C1 to Cn correspond to bypass circuits in the present invention. That is, the n capacitors C1 to Cn are bypass circuits which suppress or prevent an electric alternating-current component from flowing to the (n+1) fuses F1 to Fn+1 (interrupting elements).

Among these n capacitors C1 to Cn, the capacitor C1 is provided to connect the input ends of a pair of fuses F1 and F2 corresponding to the battery cell b1, the capacitor C2 is provided to connect the input ends of a pair of fuses F2 and F3 corresponding to the battery cell b2, the capacitor C3 is provided to connect the input ends of a pair of fuses F3 and F4 corresponding to the battery cell b3, (omission), and the capacitor Cn is provided to connect the input ends of a pair of fuses Fn and Fn+1 corresponding to the battery cell bn.

In addition, the (n+1) fuses F1 to Fn+1 are provided to correspond to electrodes of the battery pack X, that is, electrodes of the battery cells b1 to bn. Among these fuses F1 to Fn+1, one end of the fuse F1 is connected to one end of the capacitor C1 (one end of the CID d1) and the other end thereof is connected to a first input end of the overvoltage protection circuit 2. One end of the fuse F2 is connected to one end of the capacitor C2 (one end of the CID d2, that is, a negative terminal of the battery cell b1), and the other end thereof is connected to a second input end of the overvoltage protection circuit 2.

In addition, one end of the fuse F3 is connected to one end of the capacitor C3 (one end of CID d3, that is, a negative terminal of the battery cell b2), and the other end thereof is connected to a third input end of the overvoltage protection circuit 2. (Omission), moreover, one end of the fuse Fn is connected to one end of the capacitor Cn (one end of the CID dn), and the other end is connected to an nth input end of the overvoltage protection circuit 2. One end of the fuse Fn+1 is connected to the other end of the capacitor Cn (a negative terminal of the battery cell bn), and the other end is connected to an (n+1)th input end of the overvoltage protection circuit 2.

The overvoltage protection circuit 2 is provided between the shut-off circuit 1 and the cell voltage monitoring circuit 3 to correspond to each of the battery cells b1 to bn. That is, the shut-off circuit 1 and the overvoltage protection circuit 2 are provided between the battery pack X and the cell voltage monitoring circuit 3 to correspond to each of the battery cells b1 to bn. The shut-off circuit 1 is provided on a front stage, that is, the battery pack X side, and the overvoltage protection circuit 2 is provided on a rear stage, that is, the cell voltage monitoring circuit 3 side.

n short-circuit circuits for short-circuiting the other ends of a pair of fuses adjacent to each other in an arrangement direction of each of the battery cells b1 to bn are included. Note that, since all the n short-circuit circuits are configured in the same manner, a detailed configuration will be described below by exemplifying a short-circuit circuit corresponding to the battery cell b1. The short-circuit circuit corresponding to the battery cell b1 includes a switch circuit 2a and a filter circuit 2b connected in series as shown in FIG. 2.

The switch circuit 2a is a Zener diode that autonomously switches from an OFF state to an ON state if a voltage difference between the other end of the fuse F1 and the other end of the fuse F2 exceeds a predetermined breakdown voltage, or an electronic switch that switches between the ON state and the OFF state on the basis of a control signal input from the outside. The filter circuit 2b is a passive circuit having a predetermined time constant and dominates a transient characteristic of a short-circuit current flow which flows when the switch circuit 2a switches from the OFF state to the ON state.

A short-circuit circuit corresponding to the battery cell b1 is a circuit for protecting the cell voltage monitoring circuit 3 against overvoltage applied to the other ends of the pair of fuses F1 and F2 via a pair of connection lines L1 and L2 by the operation of the CID d1. On the other hand, the shut-off circuit 1 is a circuit that protects the overvoltage protection circuit 2 and the cell voltage monitoring circuit 3 by separating the connected state of the overvoltage protection circuit 2 and the cell voltage monitoring circuit 3 with respect to the battery pack X caused by the fuse F1 to Fn+1 being melted and cut by a short-circuit current flowing when the short-circuit circuit operates.

The cell voltage monitoring circuit 3 includes n discharge circuits 3a corresponding to each of the battery cells b1 to bn, n+1 filter circuits K1 to Kn+1 corresponding to the (n+1) connection lines L1 to Ln+1, and an LIB IC 3b, and monitors a state of the battery pack X on the basis of output voltages (cell voltages V1 to Vn) of each of the battery cells b1 to bn input via the (n+1) connection lines L1 to Ln+1, the shut-off circuit 1, and the overvoltage protection circuit 2.

In the following description, with reference to FIG. 2, a configuration of the cell voltage monitoring circuit 3 corresponding to the battery cell b1 will be described as a representative. Configurations of the cell voltage monitoring circuit 3 corresponding to the other battery cells b2 to bn are the same as the configuration corresponding to the battery cell b1. The discharge circuit 3a is a two-terminal circuit connected between the other ends of the pair of fuses F1 and F2. The discharge circuit 3a is a circuit for discharging the battery cell b1 to suppress overcharging of the battery cell b1, and more specifically, is a series circuit of a resistor (discharge resistance) and an electronic switch. Such a discharge circuit 3a discharges charge of the battery cell b1 via the resistor when the electronic switch is externally controlled to be in the ON state.

The filter circuit K1 is a low pass filter (LPF) inserted between the other end of the fuse F1 and a first input end of the LIB IC 3b. On the other hand, the filter circuit K2 is a low pass filter (LPF) inserted between the other end of the fuse F2 and a second input end of the LIB IC 3b. This pair of filter circuits K1 and K2 are circuits for removing a noise component. The LIB IC 3b detects an inter-terminal voltage of the battery cell b1 input via the pair of filter circuits K1 and K2 as a cell voltage V1. In other words, the cell voltage monitoring circuit 3 detects voltage differences between output terminals (a positive end and a negative end) of each of the battery cells b1 to bn as cell voltages V1 to Vn, and monitors states of the battery cells b1 to bn on the basis of these cell voltages V1 to Vn.

Next, an operation of the voltage detection device A1 configured in this manner will be described.

In this voltage detection device A1, the inter-terminal voltage of each of the battery cells b1 to bn constituting the battery pack X is input to the cell voltage monitoring circuit 3 via the (n+1) connection lines L1 to Ln+1, the shut-off circuit 1, and the overvoltage protection circuit 2, and the cell voltages V1 to Vn of each of the battery cells b1 to bn are detected.

Here, if any one of the battery cells b1 to bn becomes abnormal, the CID provided to the abnormal cell operates to separate the abnormal cell from normal cells, but an inter-terminal voltage related to the abnormal cell becomes an overvoltage due to this separation. Then, if this overvoltage continues to be input to the cell voltage monitoring circuit 3 via a pair of adjacent connection lines, the shut-off circuit 1, and the overvoltage protection circuit 2, the cell voltage monitoring circuit 3 will lead to failure.

For example, when the battery cell b1 becomes an abnormal cell, the overvoltage is applied to the cell voltage monitoring circuit 3 via the pair of adjacent connection lines L1 and L2, the pair of fuses F1 and F2 in the shut-off circuit 1, and the overvoltage protection circuit 2. When such an overvoltage is applied to the shut-off circuit 1 and the overvoltage protection circuit 2, the overvoltage protection circuit 2 first operates and the application of the overvoltage to the cell voltage monitoring circuit 3 is canceled. That is, when the switch circuit 2a of the overvoltage protection circuit 2 changes from the OFF state to the ON state and a short-circuit current flows through the filter circuit 2b, the application of the overvoltage to the cell voltage monitoring circuit 3 is canceled.

The short-circuit current described above is a sufficient amount of current to cause each of the fuses F1 and F2 to be melted and cut. Therefore, if the short-circuit current starts to flow, each of the fuses F1 and F2 is melted and cut when a predetermined time has elapsed, and thereby the other ends of the pair of fuses F1 and F2 are electrically opened, and consequently, the flow of the short-circuit current in the overvoltage protection circuit 2 is interrupted.

In this manner, the pair of fuses F1 and F2 are melted and cut inherently by the short-circuit current flowing in the overvoltage protection circuit 2 and cause the flow of the short-circuit current to be cancelled, and accordingly, it is not preferable for the fuses to be melted and cut due to a factor other than the short-circuit current. As a factor other than this short-circuit current, noise intruding from the outside into the pair of connection lines L1, L2, and the like is considered, but the shut-off circuit 1 includes the capacitor C1 with one end connected to one end (input end) of the fuse F1 and the other end connected to one end (input) of the fuse F2, and thus the noise does not flow into the pair of fuses F1 and F2.

Therefore, according to the first embodiment, since there are n capacitors C1 to Cn (bypass circuits) that suppress or prevent passage of the electric alternating-current component in each of the fuses F1 to Fn+1 (interrupting elements), it is possible to prevent the operation of an interrupting element, that is, melting and cutting of each of the fuses F1 to Fn+1, due to noise.

Second Embodiment

Next, a second embodiment of the present invention will be described with reference to FIG. 3.

Figure 2:
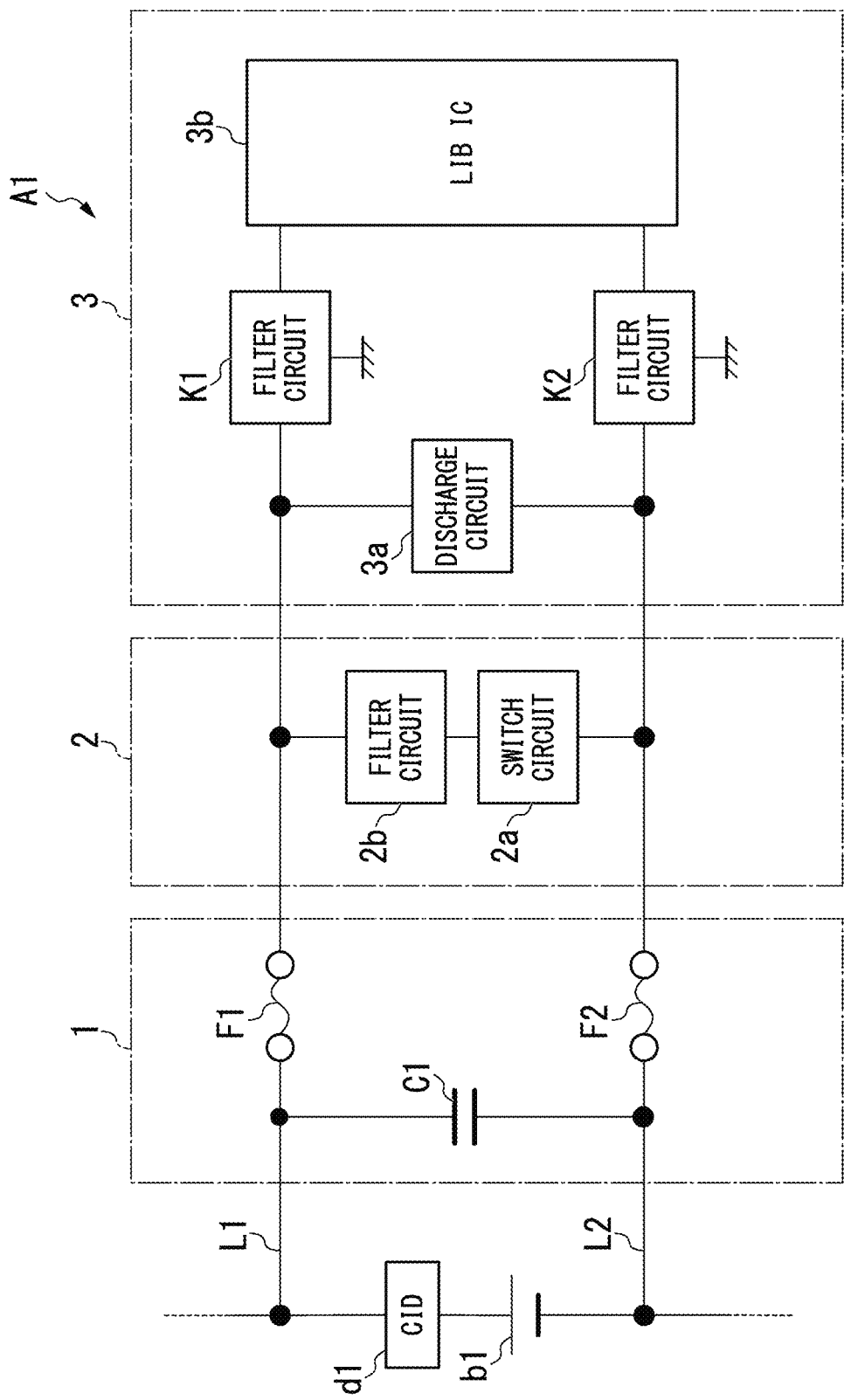
FIG. 2 is a circuit diagram which shows a configuration of a main part of the voltage detection device A1 according to the first embodiment of the present invention.
Figure 3:
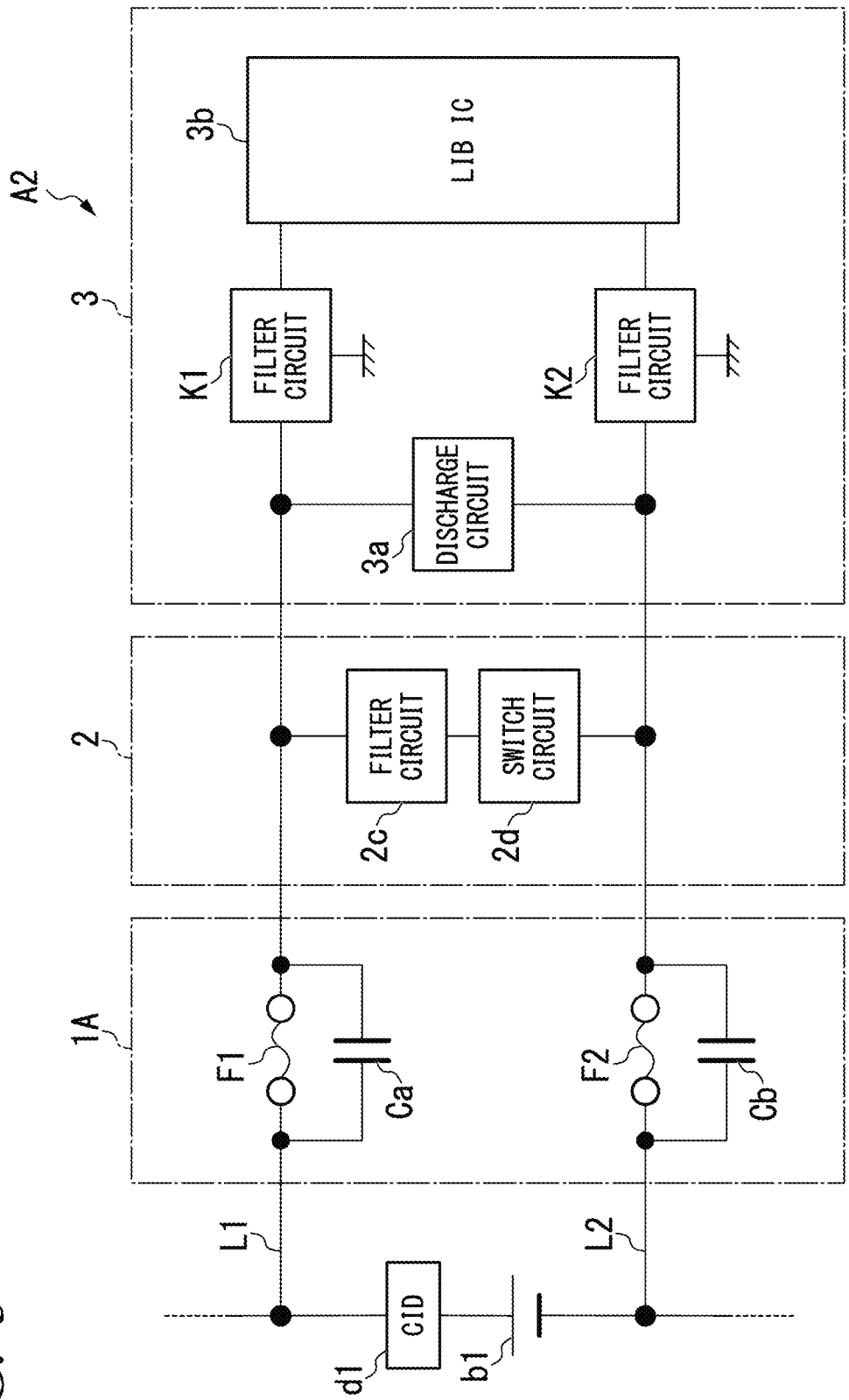
FIG. 3 is a circuit diagram which shows a configuration of a main part of a voltage detection device A2 according to a second embodiment of the present invention.

In the voltage detection device A1, as shown in FIG. 2, the capacitor C1 is provided to connect the input ends of the pair of adjacent fuses F1 and F2, but as shown in FIG. 3, the capacitors Ca and Cb are connected to the pair of fuses F1 and F2 in parallel in the voltage detection device A2 according to the second embodiment.

That is, in the voltage detection device A2, one end of the capacitor Ca is connected to one end of the fuse F1 and the other end of the capacitor Ca is connected to the other end of the fuse F1. In addition, in the voltage detection device A2, one end of the capacitor Cb is connected to one end of the fuse F2 and the other end of the capacitor Cb is connected to the other end of the fuse F2. Such capacitors Ca and Cb are similarly provided for the other fuses F3 to Fn+1, and function as a bypass circuit that suppresses or prevents the electric alternating-current component from flowing to each of the fuses F1 to Fn+1.

Therefore, according to the second embodiment, since the capacitors Ca and Cb connected in parallel to the fuses F1 to Fn+1 constituting the shut-off circuit 1 are provided, it is possible to prevent the operation of the shut-off circuit 1, that is, melting and cutting of each of the fuses F1 to Fn+1, due to noise.

Note that the present invention is not limited to the embodiments described above, and, for example, the following modified examples may be considered.

(1) In each of the embodiments described above, the battery pack X is set as a voltage detection object, but the present invention is not limited thereto. The present invention can also be applied to a single battery. In addition, in each of the embodiments described above, the cell voltage monitoring circuit 3 is set as a protection object circuit, but the present invention is not limited thereto. A circuit other than the cell voltage monitoring circuit 3 may be set as a protection object circuit.

(2) In each of the embodiments described above, the capacitors C1 to Cn are provided to connect input ends of the adjacent fuses F1 to Fn+1 (interrupting elements) or the capacitors Ca and Cb are provided in parallel for the fuses F1 to Fn+1 (interrupting elements), but the present invention is not limited thereto. In order to suppress or prevent the electric alternating-current component from flowing to each of the fuses F1 to Fn+1, at least one end of the capacitor may be connected to the input end of each of the fuses F1 to Fn+1. For example, (n+1) capacitors may be provided, one ends thereof may be connected to the input ends of the (n+1) fuses F1 to Fn+1, and the other ends thereof may be connected to a ground or an input terminal with low impedance.

Figure 4:
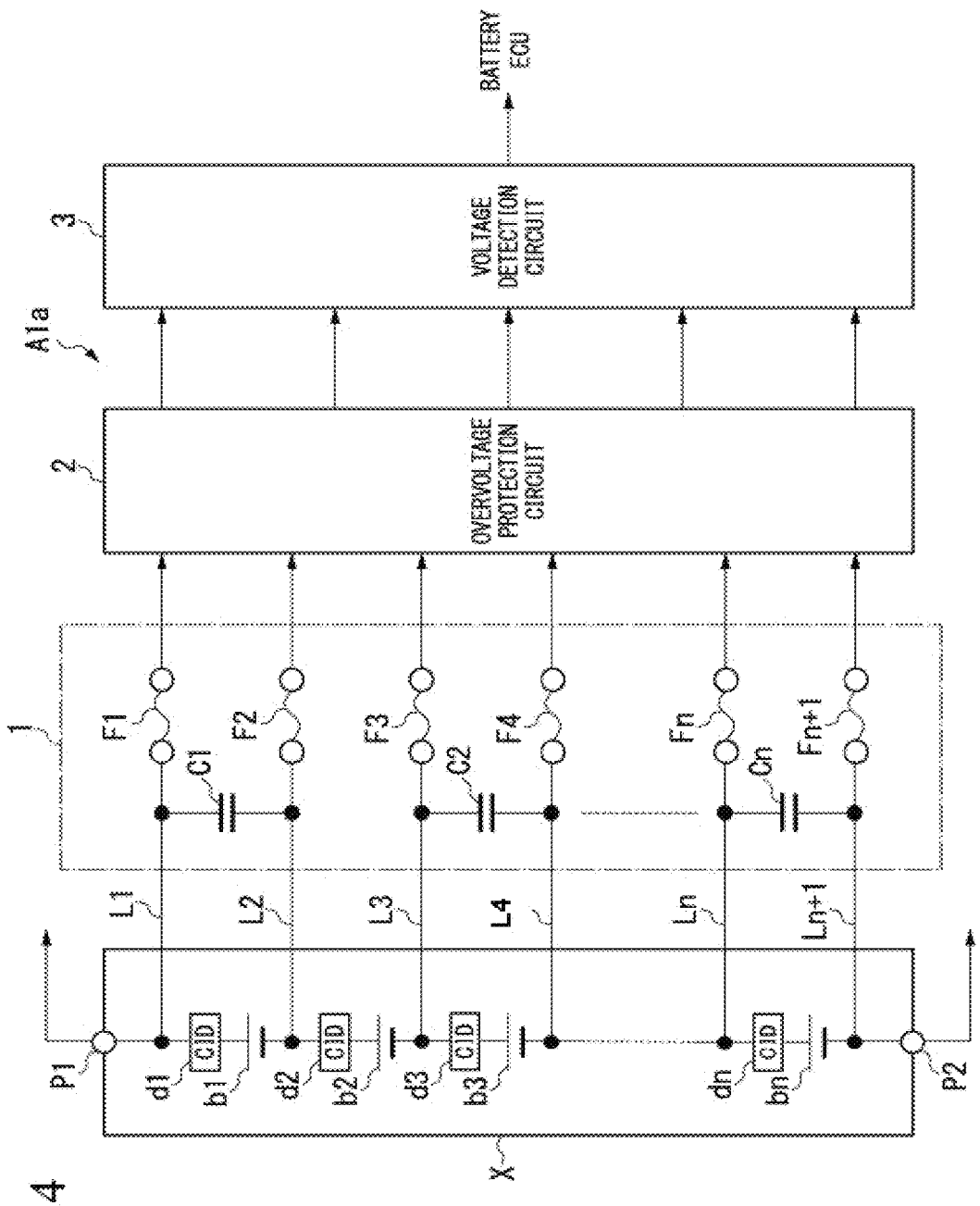
FIG. 4 is a circuit diagram which shows an overall configuration of a voltage detection device A1a according to a modified example of the first embodiment of the present invention.

(3) In the first embodiment described above, as shown in FIG. 1, n capacitors C1 to Cn are provided to correspond to all the battery cells b1 to bn, but the present invention is not limited thereto. For example, as in the voltage detection device A1*a* shown in FIG. 4, the capacitors C1, and C3 to Cn may be provided to correspond to every other one of the n battery cells adjacent to one another. Even when the capacitors C1, and C3 to Cn are provided in this manner, since one ends of the capacitors are connected between the input ends of all the fuses F1 to Fn+1 (interrupting elements), it is possible to suppress or prevent the fuses F1 to Fn+1 from being melted and cut by noise flowing to the fuses F1 to Fn+1.

REFERENCE SIGNS LIST

A1, A1*a*, A2 Voltage detection device
X Battery pack (direct-current power supply)
C1 to Cn, Ca, Cb Capacitor (bypass circuit)
F1 to Fn+1 Fuse (interrupting element)
K1 to Kn+1 Discharge circuit
1 Shut-off circuit (circuit protection device)
2 Overvoltage protection circuit
2*a* Switch circuit
2*b* Filter circuit
3 Cell voltage monitoring circuit (protection object circuit, voltage detection circuit)
3*a* Discharge circuit
3*b* LIB IC

The invention claimed is:

1. A circuit protection device which is provided between a direct-current power supply and a protection object circuit connected to the direct-current power supply, and protects the protection object circuit from an overvoltage of the direct-current power supply by shutting off a connection between the direct-current power supply and the protection object circuit using a predetermined interrupting element, the device comprising:
   a bypass circuit which suppresses an electric alternating-current component from flowing to the interrupting element, wherein:
   the direct-current power supply is a battery pack in which a plurality of battery cells are connected in series;
   the interrupting element is provided for each electrode of the plurality of battery cells;
   the bypass circuit is a capacitor with one end thereof connected to an input end of the interrupting element; and
   the capacitor is provided to connect input ends of the adjacent interrupting elements.

2. The circuit protection device according to claim 1, wherein the capacitor is provided to correspond to every other one of adjacent battery cells.

3. A voltage detection device comprising:
   the circuit protection device according to claim 1; and
   a voltage detection circuit which is the protection object circuit and detects a voltage of the direct-current power supply.

* * * * *